United States Patent
Li

(10) Patent No.: US 7,339,504 B1
(45) Date of Patent: Mar. 4, 2008

(54) COMMUNICATIONS DEVICE WITH ASYNCHRONOUS SAMPLE RATE CONVERTER

(75) Inventor: Junsong Li, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/536,852

(22) Filed: Sep. 29, 2006

(51) Int. Cl.
*H03M 7/00* (2006.01)

(52) U.S. Cl. ............... 341/61; 341/60; 375/346; 455/230

(58) Field of Classification Search ............ 341/60–70; 375/346; 455/230
See application file for complete search history.

(56) References Cited

U.S. PATENT DOCUMENTS

| | | | |
|---|---|---|---|
| 6,426,983 B1 * | 7/2002 | Rakib et al. ............. | 375/346 |
| 6,590,510 B2 | 7/2003 | Woog ..................... | 341/61 |
| 7,062,241 B2 * | 6/2006 | Kruger et al. ........... | 455/230 |
| 7,167,112 B2 * | 1/2007 | Andersen et al. ........ | 341/61 |

* cited by examiner

*Primary Examiner*—Lam T. Mai
(74) *Attorney, Agent, or Firm*—Dicke, Billig & Czaja, PLLC

(57) ABSTRACT

An asynchronous sample rate converter including a feedback loop configured to generate a control signal corresponding to an output sample rate that is synchronous with an output clock signal and a normalized time distance value corresponding to a plurality of input samples and an interpolator configured to generate an output sample in response to receiving the control signal using the normalized time distance value and outputs of at least two polyphase filter components that are generated from at least the plurality of input samples is provided.

24 Claims, 7 Drawing Sheets

COMMUNICATIONS DEVICE WITH ASYNCHRONOUS SAMPLE RATE CONVERTER

BACKGROUND

Radio frequency (RF) communications devices are used in a wide variety of applications such as cellular or mobile telephones, cordless telephones, personal digital assistants (PDAs), computers, radios and other devices that transmit or receive RF signals. Communications devices may operate according to different standards or conventions. For example, different communications devices may process digital audio signals with different sample rates. It would be desirable to be able to for communications devices to be able to process digital audio signals with different sample rates.

SUMMARY

According to one exemplary embodiment, an asynchronous sample rate converter including a feedback loop configured to generate a control signal corresponding to an output sample rate that is synchronous with an output clock signal and a normalized time distance value corresponding to a plurality of input samples and an interpolator configured to generate an output sample in response to receiving the control signal using the normalized time distance value and outputs of at least two polyphase filter components that are generated from at least the plurality of input samples is provided.

In another exemplary embodiment, a method performed by an integrated communications device is provided. The method includes generating a normalized time distance value corresponding to a plurality of input samples that are synchronous with an input clock signal, selecting at least two polyphase filter components using the normalized time distance value, generating an output for each of the at least two polyphase filter components using at least the plurality of input samples, and interpolating an output sample that is synchronous with an output clock signal using the outputs of the plurality of polyphase filter components and the normalized time distance value.

In a further exemplary embodiment, a communications device including communications circuitry configured to interface with an antenna and signal processing circuitry coupled to the communication circuitry and including an asynchronous sample rate converter (ASRC) is provided. The ASRC includes a frequency locked feedback loop configured to generate a control signal synchronous with an output clock signal and a normalized time distance value corresponding to a plurality of input samples that are synchronous with an input clock signal. The ASRC also includes an interpolator configured to generate an output sample in response to receiving the control signal using the normalized time distance value and outputs of at least two polyphase filter components that are generated from at least the plurality of input samples. The interpolator is configured to select the at least two polyphase filter components using the normalized time distance value.

In another exemplary embodiment, a communications system including a communications device, an antenna coupled to the communications device, and processing circuitry configured to communicate with the communications device is provided. The communications device includes communications circuitry and signal processing circuitry with a frequency locked feedback loop and an interpolator. The frequency locked feedback loop is configured to generate a control signal synchronous with an output clock signal and a normalized time distance value corresponding to a plurality of input samples that are synchronous with an input clock signal. The interpolator is configured to generate an output sample in response to receiving the control signal using the normalized time distance value and outputs of at least two polyphase filter components that are generated from at least the plurality of input samples, and the interpolator is configured to select the at least two polyphase filter components using the normalized time distance value.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, embodiments of integrated low power communications devices are provided for use in receiving radio-frequency (RF) signals or signals from other frequency bands. The embodiments include an asynchronous sample rate converter configured to perform sample rate conversion between asynchronous input and output sample rates and track any frequency variation between input and output sampling clocks. The communications device performs sample rate conversion between digital input signals that are synchronous to an input clock signal and digital output signals (e.g., a digital audio output signal) that are synchronous to an output clock signal where the input and the output clock signals are asynchronous. The digital input signals may be generated from received analog input signals (e.g., analog audio RF input signals).

The communications devices described herein may be used in a wide variety of integrated communications systems. Although terrestrial RF communications devices, e.g., FM and AM communication devices, are described herein, these communications devices are presented by way of example. In other embodiments, other broadcast bands may be used.

Figure 1A:
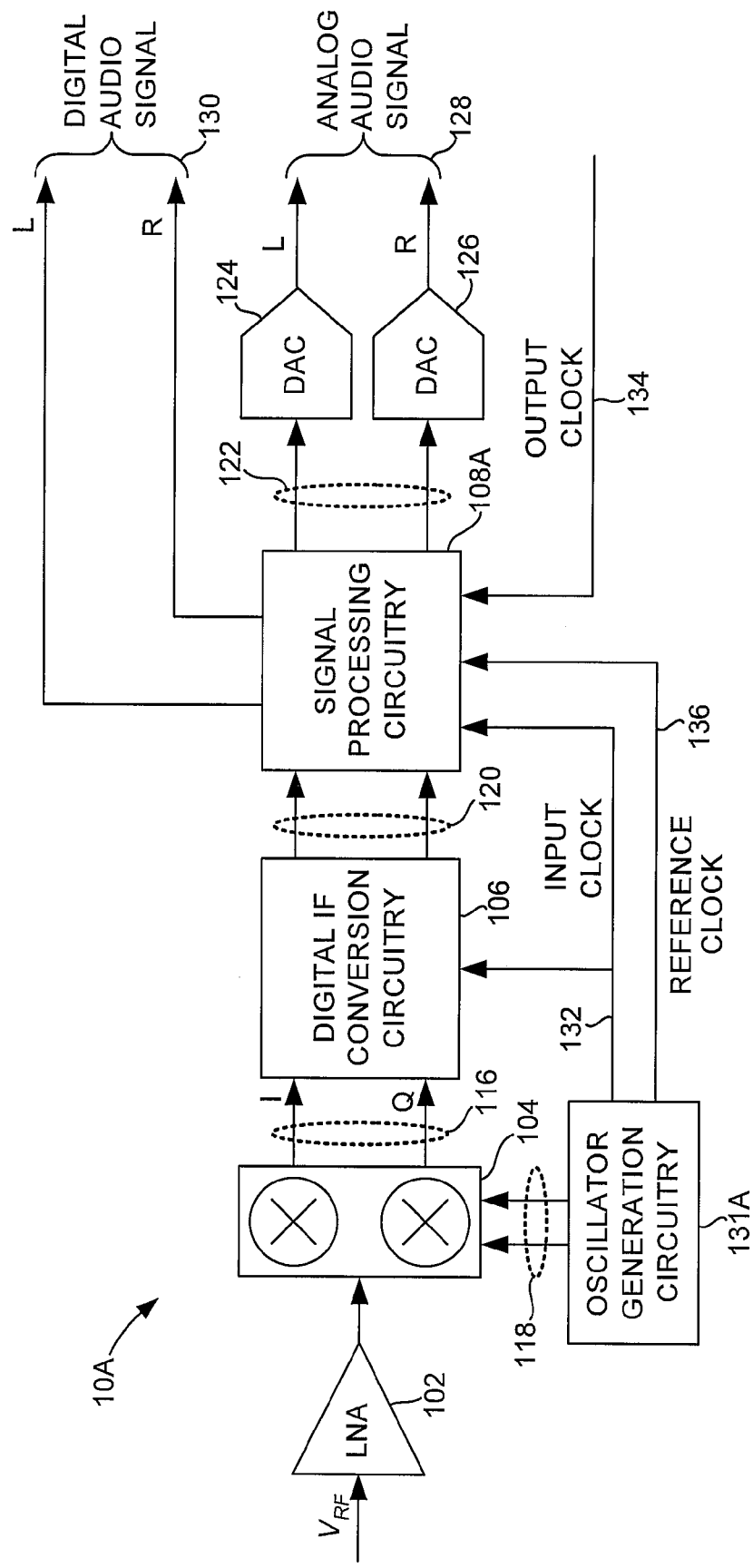
FIGS. 1A-1B are block diagrams illustrating embodiments of communications devices.
Figure 1B:
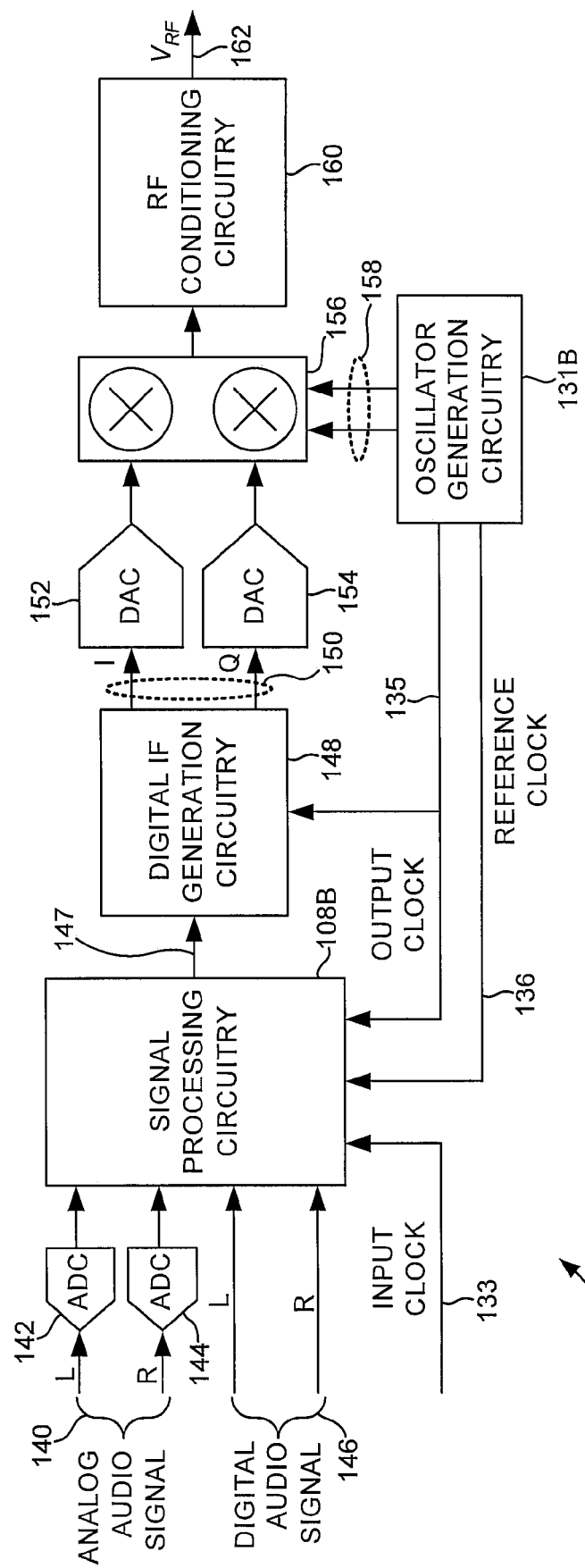

FIGS. 1A and 1B are block diagrams illustrating embodiments of communications devices 10A and 10B that are configured to perform asynchronous sample rate conversion between different input and output sample rates. Communications devices 10A and 10B are also configured to track any frequency variation between input and output clocks used to determine the input and output sample rates, respectively.

In FIG. 1A, communications device 10A forms a receiver that is configured to receive analog RF input signals, $V_{RF}$, and provide analog audio output signals 128 and digital audio output signals 130. A low noise amplifier (LNA) 102 receives the analog input signal from an antenna (not shown in FIG. 1A). The output of LNA 102 is provided to mixer 104, and mixer 104 generates real (I) and imaginary (Q) output signals, as represented by signals 116. To generate signals 116, mixer 104 uses phase shifted local oscillator (LO) mixing signals 118. Oscillator generation circuitry 131A includes oscillation circuitry (not shown) and outputs two out-of-phase LO mixing signals 118 that are used by mixer 104. The outputs of mixer 104 are at a low intermediate frequency (IF), which can be designed to be fixed or may be designed to vary, for example, if discrete step tuning is implemented for oscillator generation circuitry 131A. An example of large step LO generation circuitry that utilizes discrete tuning steps is described in the co-owned and co-pending U.S. patent application Ser. No. 10/412,963, which was filed Apr. 14, 2003, which is entitled "RECEIVER ARCHITECTURES UTILIZING COARSE ANALOG TUNING AND ASSOCIATED METHODS," and which is hereby incorporated by reference in its entirety.

Digital IF conversion circuitry 106 receives the real (I) and imaginary (Q) signals 116 and outputs real and imaginary digital signals, as represented by signals 120. Digital IF conversion circuitry 106 includes band-pass or low-pass analog-to-digital converter (ADC) circuitry (not shown) that converts the low-IF input signals to digital signals at an input sample rate that is synchronous to input clock signal 132. The input sample rate may be approximately 64 kilosamples per second +/−3% in one embodiment. Digital IF conversion circuitry 106 provides, in part, analog-to-digital conversion, signal gain and signal filtering functions. Digital IF conversion circuitry 106 provides signals 120 to signal processing circuitry 108A.

As used herein, digital IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low IF frequency for FM broadcasts within the United States would be an IF frequency equal to or below about 600 kHz. It is further noted that for spectrums with non-uniform channel spacings, a low IF frequency would be equal to or below about three steps in the channel tuning resolution of the receiver circuitry. For example, if the receiver circuitry were configured to tune channels that are at least about 100 kHz apart, a low IF frequency would be equal to or below about 300 kHz. As noted above, the IF frequency may be fixed at a particular frequency or may vary within a low IF range of frequencies, depending upon oscillator generation circuitry 131A utilized and how it is controlled.

Signal processing circuitry 108A performs digital filtering and digital signal processing to further tune and extract the signal information from digital output signals 120. Processing circuitry 108A produces digital signals 122. When the input signals relate to FM broadcasts, the digital processing provided by processing circuitry 108A may include, for example, FM demodulation and stereo decoding. Digital signals 122 may include left (L) and right (R) digital audio output channels that represent the content of the FM broadcast channel being tuned. Processing circuitry 108A also provides the left and right digital audio output channels of signals 122 to digital-to-analog converters (DACs) 124 and 126, respectively. DACs 124 and 126 receive the left and right digital audio output channels of signals 122, respectively, and convert digital signals 122 to analog audio output signals 128 with left and right analog audio output channels.

Communications device 10A also provides output samples (e.g., 16-bit output samples) in the form of digital audio output signals 130 at an output sample rate that is synchronous to an output clock signal 134. Output clock signal 134 may be provided to communications device 10A from a host device or other clock source external to communications device 10A (not shown) or generated asynchronously from a reference clock 136 within communications device 10A.

Communications device 10A converts the analog audio signals 100 to digital signals with an input sample rate that is synchronous to an input clock signal 132 generated by oscillator generation circuitry 131A and asynchronous to output clock signal 134. Signal processing circuitry 108A performs asynchronous sample rate conversion on samples formed from digital signals 122 to generate resampled digital audio signals at an output sample rate that is synchronous to output clock signal 134. The output sample rate may be between 32 and 48 kilosamples per second in one embodiment. Because input clock signal 132 and output clock signal 134 are asynchronous, the input sample rate differs from the output sample rate of digital audio output signals 130. Signal processing circuitry 108A also tracks any frequency variation between clock signal 132 and output clock signal 134 using a reference clock signal 136 in the process of generating the resampled digital audio signals.

In one embodiment, communications device 10A includes an Integrated Interchip Sound (I²S) interface as defined by the I²S Bus Specification available from NXP Semiconductors at http://www.nxp.com/acrobat_download/various/I2SBUS.pdf. In this embodiment, output clock signal 134 is the continuous serial clock (SCK) line defined by the I²S Bus Specification, digital audio output signals 130 are provided on the serial data (SD) line defined by the I²S Bus Specification, and communications device 10A is configured to provide digital audio output signals 130 to an external host device across the I²S interface at an output sample rate determined from the serial clock. In other embodiments, communications device 10A includes another suitable type of digital interface.

In other embodiments, the output of communications device 10A may include other desired signals, including, for example, low-IF quadrature I/Q signals from an analog-to-digital converter that are passed through a decimation filter, a baseband signal that has not yet be demodulated, multiplexed L+R and L−R audio signals, and/or any other desired output signals.

In communications device 10A, LNA 102, mixer 104, digital IF conversion circuitry 106, signal processing circuitry 108A, DACs 124 and 126, and oscillator generation circuitry 131A are located on-chip and are at least partially integrated on the same integrated circuit (i.e., on a single chip that is formed on a common substrate) according to one embodiment. In other embodiments, oscillator generation circuitry 131A is located at least partially off-chip (i.e., external to the common substrate that includes communications device 10A).

In FIG. 1B, communications device 10B forms a transmitter that is configured to transmit analog RF input signals, $V_{RF}$, using analog audio input signals 140 and digital audio input signals 146. Analog audio input signals 140 and digital audio input signals 146 each include left (L) and right (R) audio input channels.

Analog-to-digital converters (ADC) 142 and 144 receive the left and right audio input channels of analog audio signal 140, respectively. ADCs 142 and 144 convert the analog audio input channels to digital signals and provide the digital signals to signal processing circuitry 108B.

Signal processing circuitry 108B receives the digital signals from ADCs 142 and 144 and the digital audio input signal 146. Signal processing circuitry 108B performs any suitable audio processing on a selected one of the analog and digital signals such as signal conditioning (e.g., tone, amplitude, or compression) and stereo encoding for FM broadcast. Signal processing circuitry 108B provides processed signals 147 to digital intermediate frequency (IF) generation circuitry 148.

Signal processing circuitry 108B also receives digital audio input signal 146.

Communications device 10B also receives input samples (e.g., 16-bit output samples) in the form of digital audio input signals 146 at an input sample rate that is synchronous to an input clock signal 133. The input sample rate may be between 32 and 48 kilosamples per second in one embodiment. Input clock signal 133 may be provided to communications device 10B from a host device or other clock source external to communications device 10B (not shown) or generated asynchronously from reference clock 136 within communications device 10B.

Communications device 10B converts digital audio input signals 146 to digital signals 147 with an output sample rate that is synchronous to an output clock signal 135 generated by oscillator generation circuitry 131B and asynchronous to input clock signal 133. Signal processing circuitry 108B performs asynchronous sample rate conversion on samples formed from digital signals 146 to generate resampled digital audio signals at an output sample rate that is synchronous to output clock signal 135. Because input clock signal 133 and output clock signal 135 are asynchronous, the output sample rate differs from the input sample rate of digital audio input signals 146. Signal processing circuitry 108B also tracks any frequency variation between input clock signal 133 and output clock signal 135 using reference clock signal 136 in the process of generating the resampled digital audio signals.

In one embodiment, communications device 10B includes an Integrated Interchip Sound (I²S) interface. In this embodiment, input clock signal 133 is the continuous serial clock (SCK) line defined by the I²S Bus Specification, digital audio input signals 146 are provided on the serial data (SD) line defined by the I²S Bus Specification, and communications device 10B is configured to receive digital audio input signals 146 from an external host device across the I²S interface at an input sample rate determined from the serial clock. In other embodiments, communications device 10B includes another suitable type of digital interface.

Digital IF generation circuitry 148 receives processed signals 147 from signal processing circuitry 108B. Digital IF generation circuitry 148 upconverts processed signals 147 to an intermediate frequency and provides upconverted signals 150 to digital-to-analog converters (DAC) 152 and 154. In the embodiment of FIG. 10, digital IF generation circuitry 148 upconverts the processed signals to produce a quadrature output with real (I) and imaginary (Q) signals, as represented by signals 150. Digital IF generation circuitry 148 provides the real signals to DAC 152 and the imaginary signals to DAC 154. In other embodiments, digital IF generation circuitry 148 upconverts the processed signals to produce other signal types.

DACs 152 and 154 receive upconverted signals 150 from digital IF generation circuitry 148 and convert the digital upconverted signals 150 to analog signals. DACs 152 and 154 provide the analog signals to mixer 156.

Mixer 156 receives the analog signals from DACs 152 and 154. Mixer 156 upconverts the analog signals to a desired output (transmit) frequency by combining the analog signals with phase shifted local oscillator (LO) mixing signals 158 provided by local oscillator (LO) generation circuitry 131B. oscillator generation circuitry 131B includes oscillation circuitry (not shown) and outputs two out-of-phase LO mixing signals 158 that are used by mixer 156. The outputs of mixer 156 are at a low-IF, which can be designed to be fixed or may be designed to vary, for example, if discrete step tuning is implemented for oscillator generation circuitry 131B similarly to oscillator generation circuitry 131A described above. Mixer 156 also combines the real and imaginary signals such that the RF signal forms a real RF signal. Mixer 156 provides the signal to conditioning circuitry 160.

RF conditioning circuitry 160 receives the RF signal from RF mixer 156. RF conditioning circuitry 160 may filter the RF signal to remove undesired signals and adjust a signal level, i.e. amplitude, of the RF signal to a desired level. RF conditioning circuitry 1018 provides the adjusted RF voltage signal, $V_{RF}$, for transmission across an antenna (not shown in FIG. 1B).

In other embodiments, communications device 10B may include any other suitable types and arrangements of circuitry configured to generate an RF signal. For example, digital IF generation circuitry 148 may be omitted in other embodiments.

In other embodiments, the input of communications device 10B may include other desired signals, including, for example, low-IF quadrature I/Q signals from an analog-to-digital converter that are passed through a decimation filter, a baseband signal that has not yet be demodulated, multiplexed L+R and L-R audio signals, and/or any other desired output signals.

In communications device 10B, ADCs 142 and 144, signal processing circuitry 108B, digital IF generation circuitry 148, DACs 152 and 154, mixer 156, RF conditioning circuitry 160, and oscillator generation circuitry 131B are located on-chip and are at least partially integrated on the same integrated circuit (i.e., on a single chip that is formed on a common substrate) according to one embodiment. In other embodiments, oscillator generation circuitry 131B is located at least partially off-chip (i.e., external to the common substrate that includes communications device 10A).

In the embodiments of FIGS. 1A and 1B, local oscillators 131A and 131B may be voltage-controlled oscillators that are set to generate reference clock signal 136 at a frequency that depends on the tuning frequency of communications devices 10A and 10B, respectively.

In other embodiments, a communication device (not shown) may form a transceiver that includes all or selected features of both communications device 10A and communications device 10B. The communications device may operate in a transmit mode of operation and a receive mode of operation and may include antenna switch circuitry (not shown) to allow selective operation in the receive and transmit modes of operation at different times.

As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example.

For purposes of illustration, the input signals of communications device 10A described herein may be received in signal bands such as AM audio broadcast bands, FM audio broadcast bands, television audio broadcast bands, weather channel bands, or other desired broadcast bands. The output signals of communications device 10B described herein may also be received in signal bands such as AM audio broadcast bands, FM audio broadcast bands, television audio broadcast bands, weather channel bands, or other desired broadcast bands. The following table provides example frequencies and uses for various broadcast bands that may be transmitted or received by communications devices 10A and 10B.

TABLE 1

EXAMPLE FREQUENCY BANDS AND USES

| FREQUENCY | | USES/SERVICES |
|---|---|---|
| 150-535 | kHz | European LW radio broadcast 9 kHz spacing |
| 535-1700 | kHz | MW/AM radio broadcast U.S. uses 10 kHz spacing Europe uses 9 kHz spacing |
| 1.7-30 | MHz | SW/HF international radio broadcasting |
| 46-49 | MHz | Cordless phones, baby monitors, remote control |
| 59.75 (2) | MHz | U.S. television channels 2-6 (VHF_L) |
| 65.75 (3) | MHz | 6 MHz channels at 54, 60, 66, 76, 82 |
| 71.75 (4) | MHz | Audio carrier is at 5.75 MHz (FM MTS) |
| 81.75 (5) | MHz | |
| 87.75 (6) | MHz | |
| 47-54 (E2) | MHz | European television |
| 54-61 (E3) | MHz | 7 MHz channels, FM sound |
| 61-68 (E4) | MHz | Band I: E2-E4 |
| 174-181 (E5) | MHz | Band II: E5-E12 |
| 181-188 (E6) | MHz | |
| 188-195 (E7) | MHz | |
| 195-202 (E8) | MHz | |
| 202-209 (E9) | MHz | |
| 209-216 (E10) | MHz | |
| 216-223 (E11) | MHz | |
| 223-230 (E12) | MHz | |
| 76-91 | MHz | Japan FM broadcast band |
| 87.9-108 | MHz | U.S./Europe FM broadcast band 200 kHz spacing (U.S.) 100 kHz spacing (Europe) |
| 162.550 (WX1) | MHz | U.S. Weather Band |
| 162.400 (WX2) | MHz | 7 channels, 25 kHz spacing |
| 162.475 (WX3) | MHz | SAME: Specific Area Message Encoding |
| 162.425 (WX4) | MHz | |
| 162.450 (WX5) | MHz | |
| 162.500 (WX6) | MHz | |
| 162.525 (WX7) | MHz | |
| 179.75 (7) | MHz | U.S. television channels 7-13 (VHF_High) 6 MHz channels at 174, 180, 186, 192, 198, 204, 210 |
| 215.75 (13) | MHz | FM Sound at 5.75 MHz |
| 182.5 (F5) | MHz | French television F5-F10 Band III 8 MHz channels |
| 224.5 (F10) | MHz | Vision at 176, 184, 192, 200, 208, 216 MHz AM sound at +6.5 MHz |
| 470-478 (21) | MHz | Band IV-television broadcasting Band V-television broadcasting |
| 854-862 (69) | MHz | 6 MHz channels from 470 to 862 MHz U.K. System I (PAL): |

TABLE 1-continued

EXAMPLE FREQUENCY BANDS AND USES

| FREQUENCY | | USES/SERVICES |
|---|---|---|
| | | Offsets of +/−25 kHz may be used to alleviate co-channel interference AM Vision carrier at +1.25 (Lower Sideband vestigial) FMW Sound carrier at +7.25 Nicam digital sound at +7.802 French System L (Secam): Offsets of +/−37.5 kHz may be used AM Vision carrier at +1.25 (inverted video) FMW Sound carrier at +7.75 Nicam digital sound at +7.55 |
| 470-476 (14) | MHz | U.S. television channels 14-69 6 MHz channels |
| 819-825 (69) | MHz | Sound carrier is at 5.75 MHz (FM MTS) 14-20 shared with law enforcement |

Figure 2A:
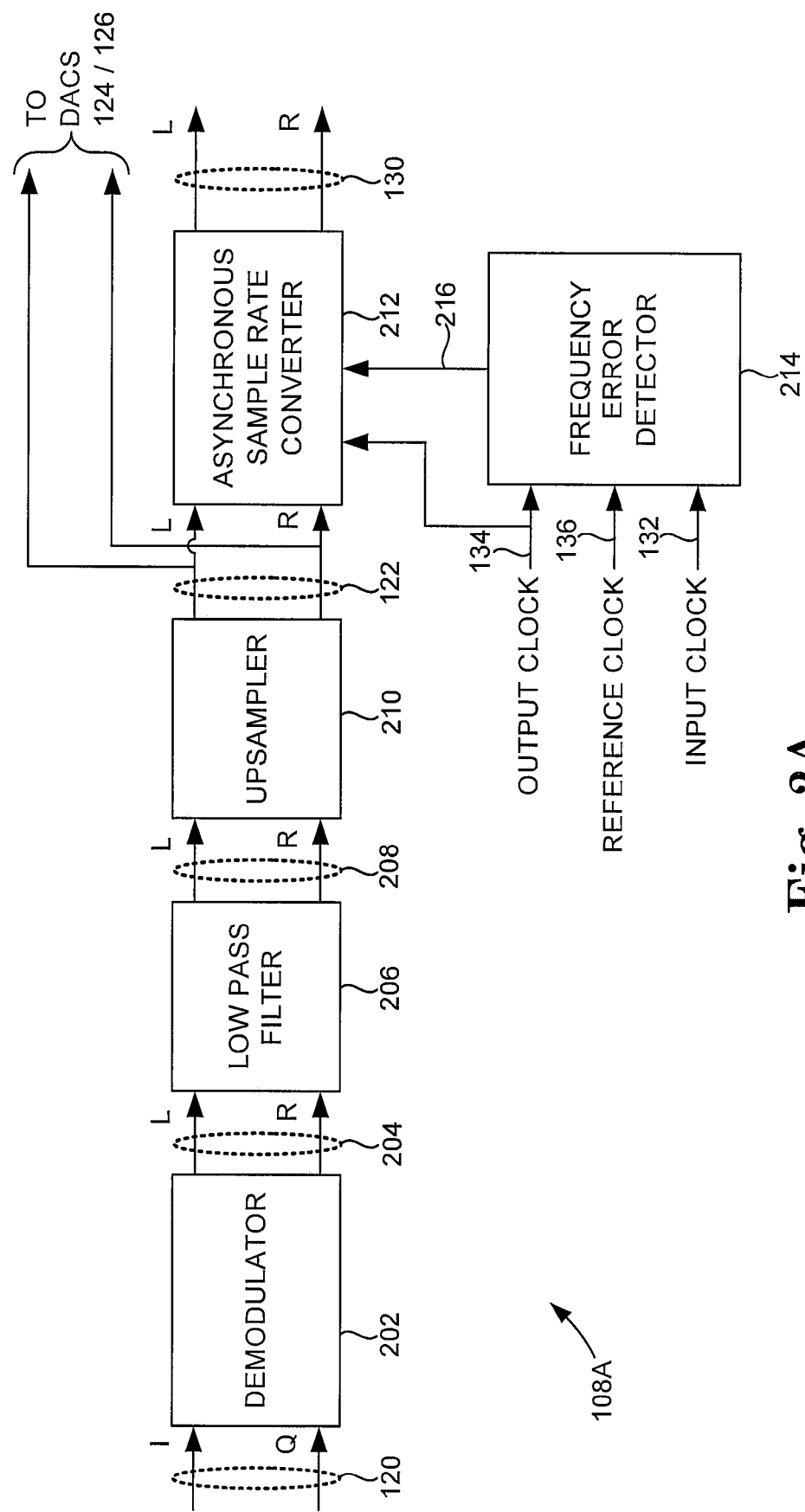
FIGS. 2A-2B are block diagrams illustrating embodiments of signal processing with asynchronous sample rate converters in communications devices.

FIG. 2A is a block diagram illustrating one embodiment of signal processing with an asynchronous sample rate converter (ASRC) 212 in communications device 10A. In one embodiment, signal processing circuitry 108A is configured to perform the functions of the embodiment of FIG. 2A. In other embodiments, signal processing circuitry 108A may perform the functions in conjunction with other hardware or software components (not shown).

A demodulator 202 receives digital signals 120 and performs demodulation on digital signals 120 and provides demodulated signals 204 with left and right channels to a low pass filter 206. In one embodiment, demodulator 202 performs FM demodulation and stereo decoding on digital signals 120. In another embodiment, demodulator 202 performs AM demodulation on digital signals 120. In other embodiments, modulator 202 may perform other types of demodulation on digital signals 120. Low pass filter 206 forms an infinite impulse response (IIR) filter that bandwidth-limits demodulated signals 204 to form filtered signals 208 and provides filtered signals 208 to an upsampler 210. Upsampler 210 upsamples filtered signals 208 by an integer upsampling factor N to generate digital signals 122 at an upsampled frequency N*Fs_IN, where Fs_IN is the input sample frequency, and provides digital signals 122 to ASRC 212 and DACs 124 and 126.

ASRC 212 receives input samples formed from digital signals 122 at an input sample rate that is synchronous to input clock signal 132 and generates output samples that form digital audio output signals 130 at an output sample rate that is synchronous to output clock signal 136. A frequency error detector 214 detects any frequency variation between input clock signal 132 and output clock signal 134 using reference clock signal 136 and provides a frequency error signal 216 to ASRC 212. In one embodiment, frequency error detector 214 includes a counter configured to determine the frequency variation by counting a number of cycles of input clock signal 132 versus a number of cycles of output clock signal 134 for a time period determined using reference clock 136. In other embodiments, frequency error detector 214 detects the frequency variation in other suitable ways. ASRC 212 receives frequency error signal 216 and uses frequency error signal 216 to adjust the output sample rate to track any frequency variation between input clock signal 132 and output clock signal 134.

Figure 2B:
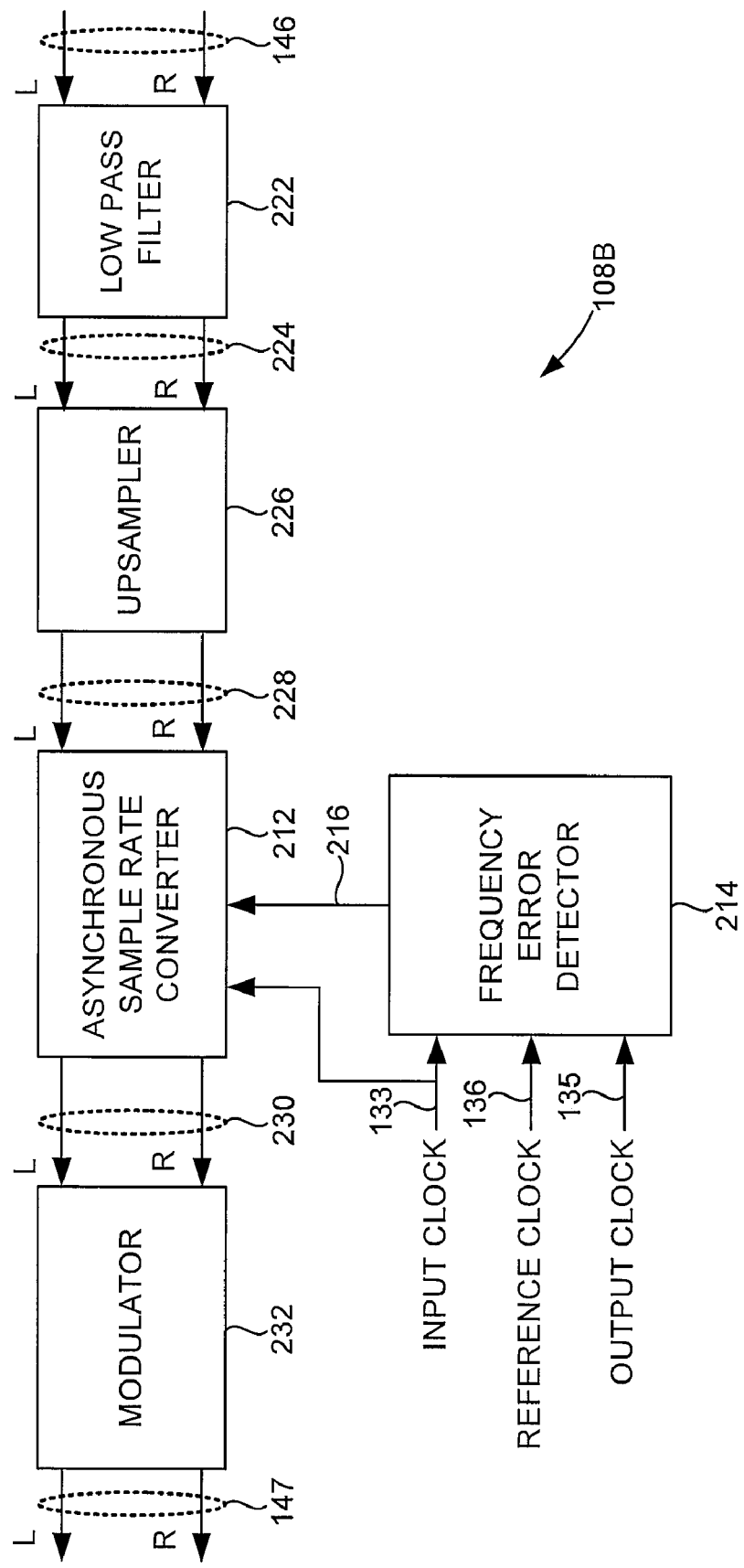

FIG. 2B is a block diagram illustrating one embodiment of signal processing with ASRC 212 in communications device 10B. In one embodiment, signal processing circuitry 108B is configured to perform the functions of the embodiment of FIG. 2B. In other embodiments, signal processing circuitry 108B may perform the functions in conjunction with other hardware or software components (not shown).

A low pass filter 222 receives digital signals 146. Low pass filter 222 forms an infinite impulse response (IIR) filter that bandwidth-limits digital signals 146 to form filtered signals 224 and provides filtered signals 224 to an upsampler 226. Upsampler 226 upsamples filtered signals 224 by an integer upsampling factor N to generate digital signals 228 at an upsampled frequency N*Fs_IN, where Fs_IN is the input sample frequency, and provides digital signals 228 to ASRC 212

ASRC 212 receives input samples formed from digital audio input signals 146 at an input sample rate that is synchronous to input clock signal 133 and generates output samples that form digital signals 230 at an output sample rate that is synchronous to output clock signal 135. Frequency error detector 214 detects any frequency variation between input clock signal 133 and output clock signal 135 using reference clock signal 136 and provides frequency error signal 216 to ASRC 212. ASRC 212 receives frequency error signal 216 and uses frequency error signal 216 to adjust the output sample rate to track any frequency variation between input clock signal 133 and output clock signal 135.

A modulator 232 receives digital signal 230, performs modulation on digital signals 230, and provides modulated signals 147 with left and right channels to digital IF generation circuitry (shown in FIG. 1B). In one embodiment, modulator 232 performs FM modulation and stereo encoding on digital signals 230. In another embodiment, modulator 232 performs AM modulation on digital signals 230. In other embodiments, modulator 232 may perform other types of modulation on digital signals 230.

Figure 3:
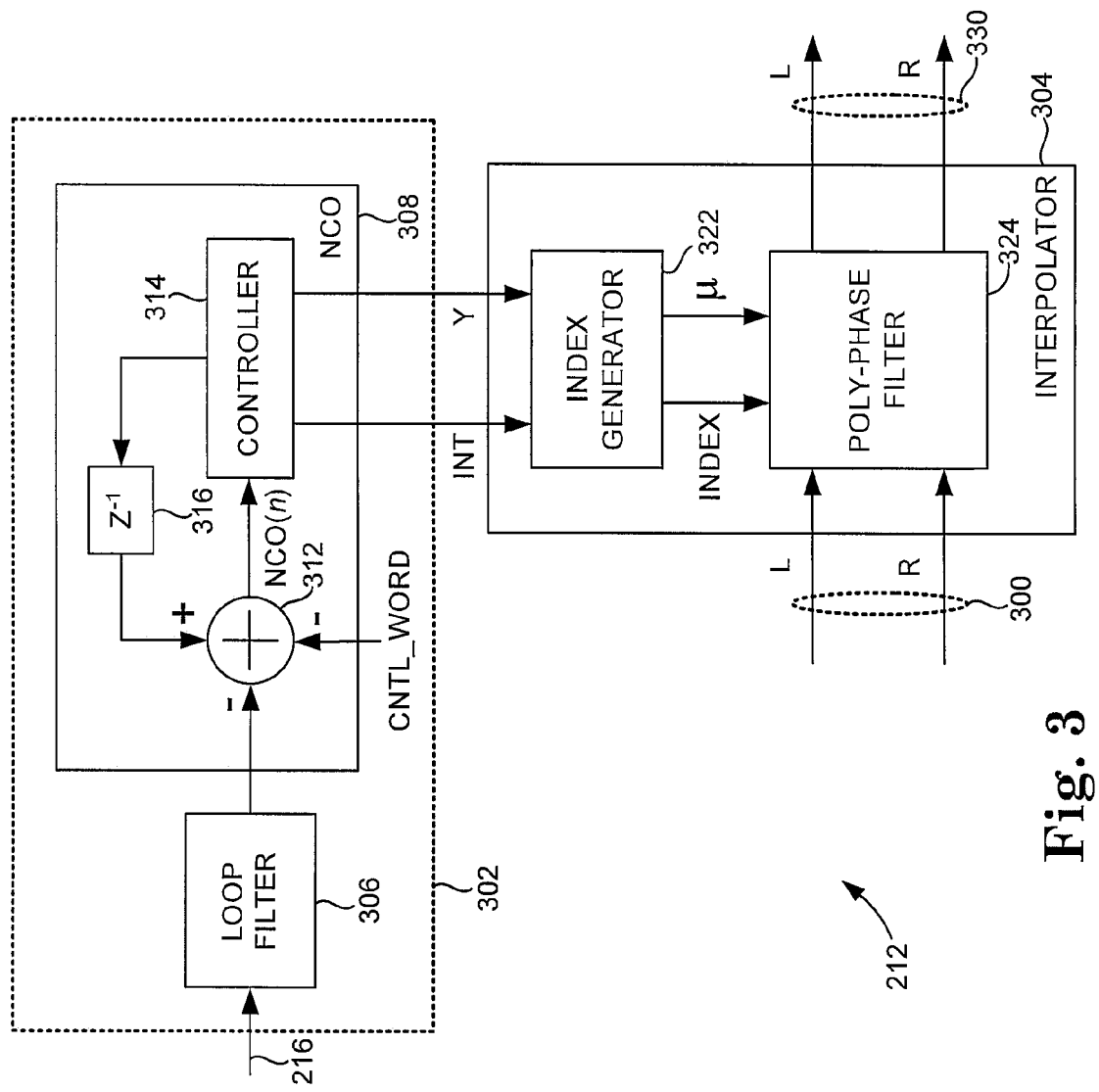
FIG. 3 is a block diagram illustrating one embodiment of an asynchronous sample rate converter.

FIG. 3 is a block diagram illustrating one embodiment of ASRC 212. ASRC 212 includes a frequency locked feedback loop 302 and an interpolator 304. ASRC 212 receives input samples formed from an input signal 300 at an input sample rate and frequency error signal 216 and generates output samples that form an output signal 330 at an output sample rate from input signal 300 and frequency error signal 216. When ASRC 212 is used in the embodiment of FIG. 2A, input signal 300 represents digital signal 122 and output signal 330 represents digital audio output signal 330. When ASRC 212 is used in the embodiment of FIG. 2B, input signal 300 represents digital signal 228 and output signal 330 represents digital signal 230.

Feedback loop 302 includes a loop filter 306 and a numerically controlled oscillator (NCO) 308. Loop filter 306 receives frequency error signal 216 and estimates the actual output sample rate relative to the input sample rate using frequency error signal 216. Loop filter 306 forms a proportional-integral (PI) controller that provides a sample frequency error estimate to NCO 308. Loop filter 306 functions as a loop-lock detector that is used to minimize resample timing jitter by reducing loop bandwidth in a tracking mode. Feedback loop 302 also receives or generates a control word signal, CNTL_WORD, that represents the ratio of the output sample rate of ASRC 212 to the input sample rate of ASRC 212. In the embodiment of FIG. 2A, the input sample rate of ASRC 212 is determined from input clock signal 132, and the output sample rate of ASRC 212 is determined from output clock signal 134. In the embodiment of FIG. 2B, the input sample rate of ASRC 212 is determined from input clock signal 133, and the output sample rate of ASRC 212 is determined from output clock signal 135.

NCO 308 receives the sample frequency error estimate from loop filter 306, generates an interpolator control signal (INT) and a normalized time distance value (Y) at each time index n, and provides the interpolator control signal and the normalized time distance value to interpolator 304 at each time index. NCO 308 runs at the upsampled frequency N*Fs_IN and corresponds to the time index n. In NCO 308, an accumulator 312 subtracts the sample frequency error estimate, FREQ_ERROR, and the control word signal value, CNTL_WORD, from the previous NCO value, NCO(n−1), provided by a delay element 316 to generate a current NCO value, NCO(n) as shown in Equation 1.

NCO(n)=NCO(n−1)−CNTL_WORD−FREQ_ERROR    Equation 1

A controller 314 receives the current NCO value, NCO (n), and generates the interpolator control signal and the normalized time distance value for the time index n. The interpolator control signal indicates a time for interpolator 304 to generate an output sample, and the normalized time distance value indicates a normalized time distance between two adjacent input samples in which to generate the output sample. Controller 314 provides the interpolator control signal and the normalized time distance value for each time index n to interpolator 304.

In one embodiment, controller 314 generates the interpolator control signal and the normalized time distance value for each time index n using Equations 2 and 3, respectively.

$$INT = \begin{cases} 1 & \text{if } NCO(n) \leq 0 \\ 0 & \text{if } NCO(n) > 0 \end{cases} \qquad \text{Equation 2}$$

$$Y = 1 - \frac{|NCO(n)|}{\text{CNTL\_WORD}} \qquad \text{Equation 3}$$

In other embodiments, controller 314 generates the interpolator control signal and the normalized time distance value for each time index n in other suitable ways.

Interpolator 304 receives the interpolator control signal and the normalized time distance value from NCO 308 and input signal 300. Interpolator 304 generates an output sample using input signal 300 and the normalized time distance value in response to the interpolator control signal. For each output sample that forms output signal 330, interpolator 304 virtually upsamples input signal 300 with a poly-phase filter 324 and calculates the output sample by linearly interpolating two adjacent poly-phase filtered samples. Interpolator 304 selects the two adjacent poly-phase filtered samples using an index value, INDEX, provided by an index generator 322 and linearly interpolates two adjacent poly-phase filtered samples using a residue value, μ, provided by index generator 322 to calculate each output sample.

Index generator 322 receives interpolator control signal and the normalized time distance value, generates the index value and the residue value from the normalized time distance value using Equations 4 and 5.

INDEX=floor(Y*M)    Equation 4

μ=(Y*M)−floor(Y*M)    Equation 5

In Equations 4 and 5, Y is calculated using Equation 3, M is the virtual upsample factor (e.g., 16), and floor is a floor operator that extracts the integer portion of the product of Y and M.

Figure 4:
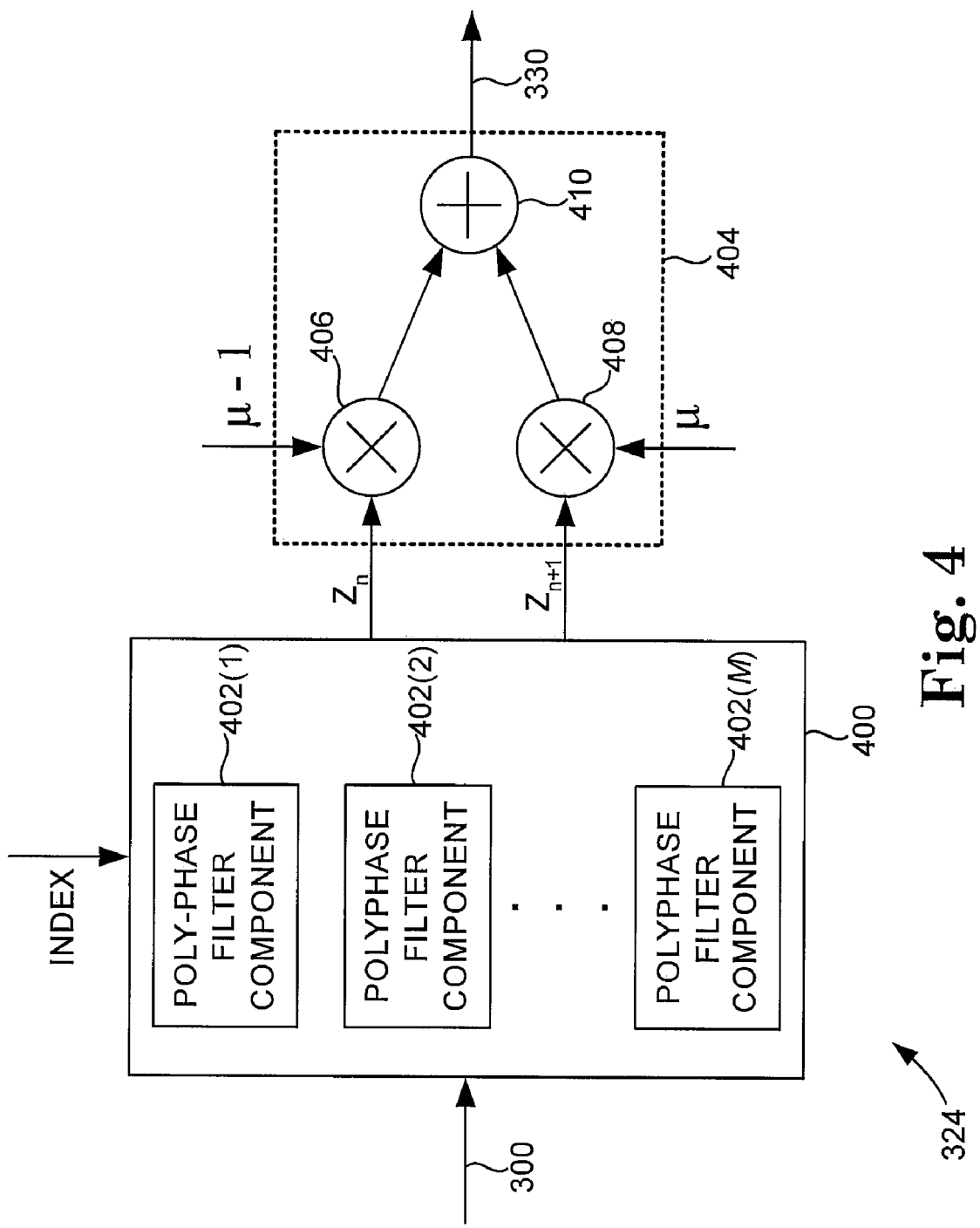
FIG. 4 is a block diagram illustrating one embodiment of a polyphase filter.

FIG. 4 is a block diagram illustrating one embodiment of poly-phase filter 324. Poly-phase filter 324 forms a band-stop finite impulse response (FIR) filter and includes a set 400 of poly-phase filter components 402(1)-402(M) and a sample generator 404.

Poly-phase filter components 402 each receive input signals 300 and, when selected using the index signal calculated by index generator 322, produce a respective output. The value of the index signal selects two adjacent poly-phase filter components 402 to generate outputs $Z_n$ and $Z_{n+1}$ and provides the two outputs to sample generator 404. In sample generator 404, a multiplier 406 multiplies the output $Z_n$ by $1-\mu$ and provides the product to an accumulator 410. A multiplier 408 multiplies the output $Z_{n+1}$ by $\mu$ and provides the product to accumulator 410. Accumulator 410 sums the products from multipliers 406 and 408 to calculate an output sample that forms digital signal 330. Accordingly, sample generator 406 linearly interpolates the outputs of two adjacent poly-phase filter components 402 to calculate each output sample.

Figure 5:
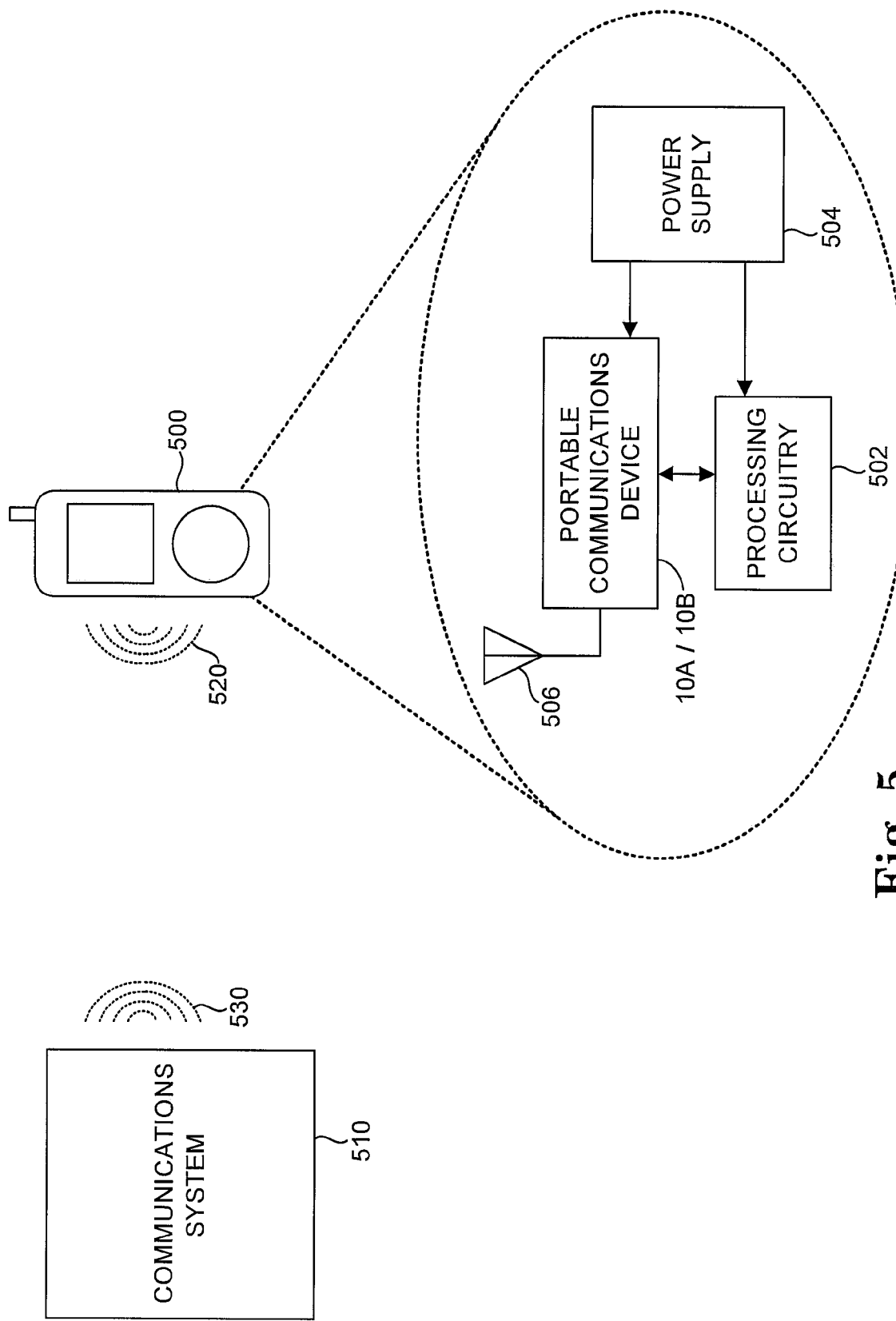
FIG. 5 is a block diagram illustrating one embodiment of a portable communications system that includes a communications device.

FIG. 5 is a block diagram illustrating one embodiment of a portable communications system 500 that includes communications device 10A (as shown in FIG. 1A) or 10B (as shown in FIG. 1B). Portable communications system 500 may be any type of portable or mobile communications device such as a mobile or cellular telephone, a personal digital assistant (PDA), an audio and/or video player (e.g., an MP3 or DVD player), a wireless telephone, and a notebook or laptop computer. Portable communications system 500 includes communications device 10A or 10B, processing circuitry 502, a power supply 504, and an antenna 506 among other components not shown.

Processing circuitry 502 receives information from a user and provides the information to communications device 10A/10B. Processing circuitry 502 also receives information from mobile communications device 10A/10B and provides the information to a user. The information may include voice and/or data communications, audio, video, image, or other graphical information. Processing circuitry 502 includes any number and types of input and/or output devices to allow a user provide information to and receive information from portable communications system 500. Examples of input and output devices include a microphone, a speaker, a keypad, a pointing or selecting device, and a display device.

Power supply 504 provides power to communications device 10A/10B and input/output system 502. Power supply 504 includes any suitable portable or non-portable power supply such as a battery or an AC plug.

Communications system 500 may communicate with communications system 510 or other remotely located hosts in radio frequencies using antenna 506. Communications system 500 may receive information from communications system 510 or other remotely located hosts in radio frequencies as indicated by a signal 530 using antenna 506. Communications system 500 may also transmit information to communications system 510 or other remotely located hosts in radio frequencies as indicated by a signal 520 using antenna 506. In other embodiments, communications system 500 communicates with communications system 510 or one or more remotely located hosts using other suitable frequency bands.

In the above embodiments, a variety of circuit and process technologies and materials may be used to implement the communications systems according to the invention. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An asynchronous sample rate converter comprising:
   a feedback loop configured to generate a control signal corresponding to an output sample rate that is synchronous with an output clock signal and a normalized time distance value corresponding to a plurality of input samples; and
   an interpolator configured to generate an output sample in response to receiving the control signal using the normalized time distance value and outputs of at least two polyphase filter components that are generated from at least the plurality of input samples.

2. The asynchronous sample rate converter of claim 1 wherein the interpolator is configured to select the at least two polyphase filter components using the normalized time distance value.

3. The asynchronous sample rate converter of claim 1 wherein the interpolator is configured to generate the output sample by linearly interpolating outputs from the at least two polyphase filter components using a residue value determined from the normalized time distance value.

4. The asynchronous sample rate converter of claim 1 wherein the plurality of input samples are upsampled prior to being provided to the interpolator.

5. The asynchronous sample rate converter of claim 1 wherein the plurality of input samples are filtered prior to being provided to the interpolator.

6. The asynchronous sample rate converter of claim 1 wherein the feedback loop includes a numerically controlled oscillator configured to generate the control signal and the normalized time distance value.

7. The asynchronous sample rate converter of claim 6 wherein the feedback loop includes a loop filter configured to filter a frequency error signal and provide a filtered signal to the numerically controlled oscillator.

8. A method performed by an integrated communications device, the method comprising:
   generating a normalized time distance value corresponding to a plurality of input samples that are synchronous with an input clock signal;
   selecting at least two polyphase filter components using the normalized time distance value;
   generating an output for each of the at least two polyphase filter components using at least the plurality of input samples; and
   interpolating an output sample that is synchronous with an output clock signal using the outputs of the plurality of polyphase filter components and the normalized time distance value.

9. The method of claim 8 further comprising:
   generating a frequency error signal that indicates a frequency variation between the input clock signal and the output clock signal; and generating the normalized time distance value using the frequency error signal.

10. The method of claim 9 further comprising:
filtering the frequency error signal prior to generating the normalized time distance value.

11. The method of claim 8 wherein the input clock signal and the output clock signal are asynchronous.

12. The method of claim 8 further comprising:
providing the output sample to communications circuitry.

13. The method of claim 8 further comprising:
receiving the input sample from communications circuitry.

14. A communications device comprising
communications circuitry configured to interface with an antenna; and
signal processing circuitry coupled to the communication circuitry and including an asynchronous sample rate converter (ASRC);
wherein the ASRC includes a frequency locked feedback loop configured to generate a control signal synchronous with an output clock signal and a normalized time distance value corresponding to a plurality of input samples that are synchronous with an input clock signal, wherein the ASRC includes an interpolator configured to generate an output sample in response to receiving the control signal using the normalized time distance value and outputs of at least two polyphase filter components that are generated from at least the plurality of input samples, and wherein the interpolator is configured to select the at least two polyphase filter components using the normalized time distance value.

15. The communications device of claim 14 wherein the communications circuitry is configured to generate the plurality of input samples from a radio frequency (RF) signal received across the antenna, and wherein the signal processing circuitry is configured to receive the plurality of input samples from the communications circuitry.

16. The communications device of claim 14 wherein the signal processing circuitry is configured to provide the output sample to the communications circuitry, and wherein the communications circuitry is configured to generate a radio frequency (RF) signal from the output sample and transmit the RF signal across the antenna.

17. The communications device of claim 14 wherein the signal processing circuitry is configured to provide the output sample to an external host.

18. The communications device of claim 14 wherein the signal processing circuitry is configured to receive the plurality of input samples from an external host.

19. The communications device of claim 14 further comprising:
an Integrated Interchip Sound (I$^2$S) interface coupled to the signal processing circuitry.

20. A communications system comprising:
a communications device including:
communications circuitry; and
signal processing circuitry coupled to the communication circuitry and including a frequency locked feedback loop and an interpolator;
an antenna coupled to the communications device; and
processing circuitry configured to communicate with the communications device;
wherein the frequency locked feedback loop is configured to generate a control signal synchronous with an output clock signal and a normalized time distance value corresponding to a plurality of input samples that are synchronous with an input clock signal, wherein the interpolator is configured to generate an output sample in response to receiving the control signal using the normalized time distance value and outputs of at least two polyphase filter components that are generated from at least the plurality of input samples, and wherein the interpolator is configured to select the at least two polyphase filter components using the normalized time distance value.

21. The communications system of claim 20 wherein the communications circuitry includes receiver circuitry configured to receive a signal across the antenna, and wherein the receiver circuitry is configured to generate the plurality of input samples from the signal.

22. The communications system of claim 21 wherein the communications circuitry is configured to provide the output sample to the processing circuitry.

23. The communications system of claim 20 wherein the communications circuitry includes transmitter circuitry configured to generate a signal from the output sample, and wherein the transmitter circuitry is configured to transmit the signal across the antenna.

24. The communications system of claim 23 wherein the communications circuitry is configured to receive the plurality of input samples from the processing circuitry.

* * * * *